United States Patent [19]

Brace et al.

[11] 4,319,236

[45] Mar. 9, 1982

[54] HALL EFFECT POSITION DETECTOR

[75] Inventors: Paul H. Brace; Wilbur P. Balmer, both of Rockford, Ill.

[73] Assignee: Barber-Colman Company, Rockford, Ill.

[21] Appl. No.: 176,163

[22] Filed: Aug. 7, 1980

[51] Int. Cl.³ .......................................... G01R 33/06
[52] U.S. Cl. .................... 340/679; 307/116; 310/15; 335/205; 338/32 H; 340/686
[58] Field of Search ............ 340/679, 686; 338/32 H; 335/205; 307/116; 310/15, 20, DIG. 3

[56] References Cited

U.S. PATENT DOCUMENTS

| | | | |
|---|---|---|---|
| 1,061,514 | 11/1911 | Anderson | 340/679 X |
| 3,419,798 | 12/1968 | Walton | 340/686 X |
| 3,473,109 | 10/1969 | Maaz et al. | 340/686 X |
| 3,852,661 | 12/1974 | Szabo et al. | 340/686 X |
| 3,896,280 | 7/1975 | Blake | 340/686 X |
| 4,107,604 | 8/1978 | Bernier | 338/32 H X |

Primary Examiner—John W. Caldwell, Sr.
Assistant Examiner—Joseph E. Nowicki
Attorney, Agent, or Firm—Robert M. Hammes, Jr.

[57] ABSTRACT

A position detector providing an electrical position feedback signal proportional to relative mechanical movement between two elements employs a hall effect device to sense changes in magnetic flux density resulting from relative movement of the hall effect device with respect to an adjacent magnetic field, the hall effect device producing an electrical signal proportional to magnetic flux density which signal comprises the electrical position feedback signal. The hall effect device and magnet are supported in respective relatively movable members in cooperative relationship such that the magnet is adjacent the hall effect device so as to permit relative movement of the hall effect device with respect to the magnetic field, the members being preferably adapted for mounting respectively on two relatively movable mechanical elements.

8 Claims, 3 Drawing Figures

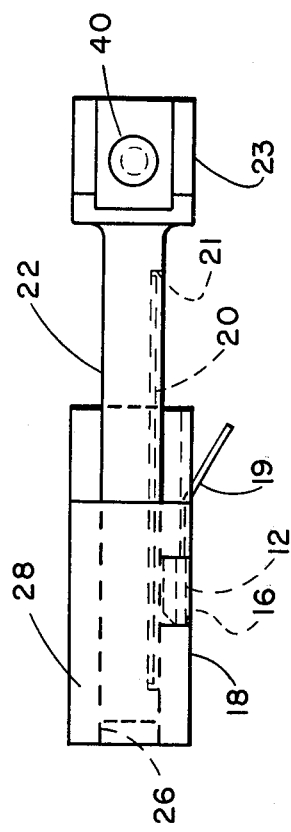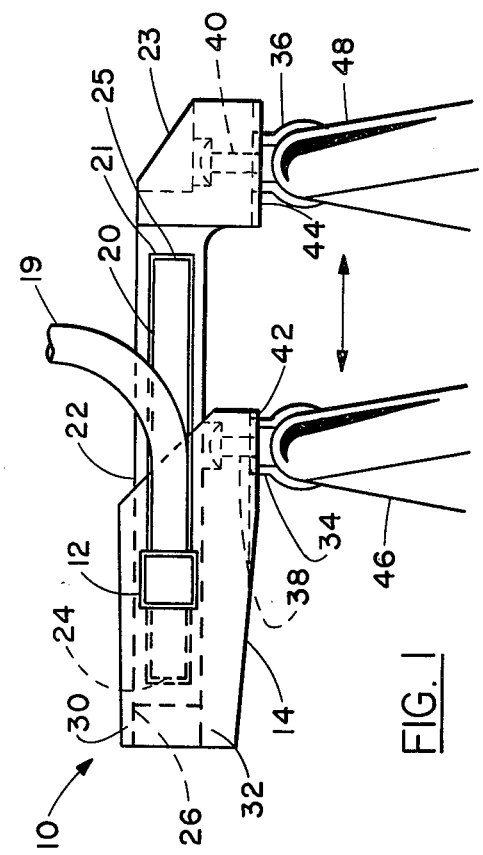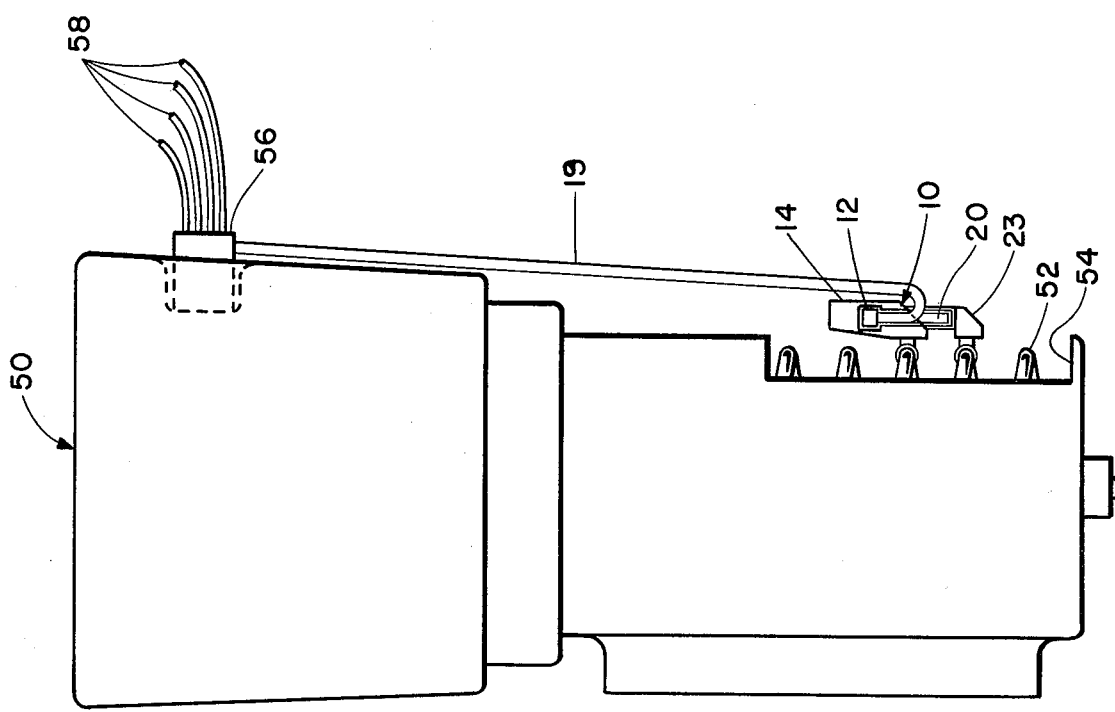

HALL EFFECT POSITION DETECTOR

BACKGROUND OF THE INVENTION

This invention relates to position sensing or detecting devices for providing a feedback signal proportional to the relative movement between two mechanical elements and which is indicative of the relative position of two such elements. In particular, the invention relates to position detecting devices responsive to the relative linear movement of mechanical elements.

There are many applications in which it is required to provide a signal indicative of the relative movement between mechanical elements. A typical example is a valve actuator having a piston or rod with a certain operating stroke. The position of the valve is typically controlled by means of an electrical signal provided to an electro-mechanical operator within the actuator which controls the movement of the piston rod. Heretofore, the desired electrical feedback signal indicative of piston position, and consequently valve position, has been provided by means of a linear potentiometer associated with the piston or rod.

There are certain problems involved in the use of such potentiometers which adversely affect the overall efficiency of the actuator. Problems are frequently encountered in maintaining satisfactory wiper contact in the potentiometer. In addition, depending on the environment in which the device is operating, substantial reliability problems may be encountered due to atmospheric contamination resulting from moisture, chemicals, corrosion and the like. Such problems substantially increase maintenance costs. Linear potentiometers are also comparatively expensive due to the high costs of precious metals required and the relative difficulty in manufacturing as compared with circular potentiometers.

Further, the linear potentiometers typically must have an effective length equal to the stroke of the piston or rod. This requirement of a one to one relationship often necessitates a size of potentiometer which presents problems from the standpoint of space limitations in certain applications.

It is thus desirable to provide a relatively low-cost position detector which eliminates or substantially reduces the problems heretofore encountered in employing linear potentiometers to provide the required position feedback signal.

SUMMARY OF THE INVENTION

According to the invention, the foregoing problems are solved by employing a magnetic flux density sensor for providing an electrical signal in response to changes in a magnet field in combination with means for producing a magnetic field adjacent to the sensor, the sensor being mounted in a support member for relative movement with respect to the magnetic field. The sensor produces an electrical signal proportional to sensed magnetic flux density. Since the flux density varies over the area of the magnetic field, the electrical signal varies as the sensor moves within the field. The electrical signal from the sensor is thus indicative of the relative position of the sensor within the magnetic field.

In the preferred embodiment the magnetic field sensor comprises a hall effect device which is mounted in a support member. The means for producing the magnetic field comprises an elongated planar magnet having north and south poles which is mounted on an elongated arm of a magnet support member, the arm being in sliding engagement with a portion of the sensor support member with the magnet adjacent the hall effect device so as to facilitate linear relative movement of the hall effect device within the magnetic field produced by the magnet. Since the magnetic flux density varies over the length of the magnet, the hall effect device provides an electrical signal which varies in response to relative movement between the two support members and is indicative of the position of the hall effect device in the magnetic field.

The support members are preferably further provided with individual means for mounting the members upon relative linear movable mechanical elements such as the coils of a spring biasing a positionable piston in an actuator. The sensor will then provide a signal in response to such relative movement which can be used as a position feedback signal indicative of piston position, as an example.

The invention provides a low-cost, easily constructed position detector which does not have electrical contact problems and which can be easily adapted to numerous position detecting applications. Other objects and advantages will be apparent from the following detailed description taken in conjunction with the drawing figures.

BRIEF DESCRIPTION OF THE DRAWINGS

FIG. 1 is a side elevation of an embodiment of a position detector according to the invention shown mounted on the coils of a spring.

FIG. 2 is a top view of the position detector shown in FIG. 1.

FIG. 3 is a side elevation of a typical valve actuator with the position detector shown in FIG. 1 mounted on the coils of the actuator spring.

DESCRIPTION OF THE PREFERRED EMBODIMENT

According to the present invention, the desired position feedback signal proportional to relative movement between two elements or indicative of the relative position of such elements is provided by employing the combination of means for producing a magnetic field and a magnetic flux density sensor which provides an electrical signal proportional to magnetic flux density. The two components are individually supported for relative linear movement with the sensor adjacent to the magnetic field. It will be readily apparent to those skilled in the art that there are numerous ways in which the sensor and magnetic field producing means can be mounted on relatively movable mechanical elements to provide a desired position feedback signal. For example, either the sensor or the magnetic field producing means could be mounted directly on a stationary member with the other mounted on an adjacent movable member. Further, both could be mounted directly on movable members of a device. Alternatively, the sensor and magnetic field producing means can be mounted on relatively movable support members which can be suitably adapted for mounting in turn on movable elements or members of a device. In order to facilitate understanding of the invention, an exemplary embodiment of the invention is disclosed and described herein which is particularly useful in conjunction with an actuator having a spring-biased piston which is positioned in response to electrical control signals. Since the relative movement or position of the coils of the spring is proportional to the movement or position of the piston, the spring coils can be utilized as the relatively moving mechanical elements upon which the position detector of the invention is mounted.

Referring now to FIGS. 1 and 2, a position detector, generally indicated at 10, comprises a magnetic flux density sensor such as hall effect device 12 mounted on support member 14 in opening 16 of side wall 18. Hall effect device 12 produces an electrical signal proportional to sensed magnetic flux density and is provided with electrical lead 19 for transmitting the signal to a utilization device. Suitable hall effect devices are commercially available in the form of hall effect integrated circuits. Position detector 10 additionally comprises a means for producing a magnetic field such as an elongated planar magnet 20 mounted in a recessed side portion 21 of elongated arm 22 of support member 23. Magnet 20 preferably produces a magnetic field having north and south poles proximate respective ends 24, 25 of magnet 20.

Support members 14, 23 are preferably made of molded plastic and are adapted to cooperate with each other so that magnet 20 is positioned for relative linear movement adjacent to hall effect device 12. Support members 14, 23 are preferably so constructed that arm 22 is guidingly engaged by a portion of support member 14 so that magnet 20 is maintained proximate to hall effect device 12 during relative linear movement therebetween. In the preferred embodiment support member 14 is provided with an elongated opening or passageway 26 formed by the interior surfaces of side walls 18, 28, top wall 30 and bottom wall 32 for receiving elongated arm 22 of support member 23. As best seen in FIG. 2 opening 16 extends through side wall 18 so that hall effect device 12 can be positioned adjacent to magnet 20.

As is apparent from the foregoing, the embodiment described provides a construction which assures that the distance between hall effect device 12 and magnet 20 is maintained substantially constant during relative linear movement so as to maintain a high degree of reliability in the electrical signal produced.

Since hall effect device 12 and magnet 20 are supported independently, support members 14, 23 can be mounted on two relatively movable mechanical elements so that hall effect device 12 provides an electrical signal indicative of the relative movement or position of such elements. In order to facilitate mounting, support members 14, 23 are provided with mounting means such as resilient clips 34, 36 secured by means of rivets 38, 40 to bases 42, 44 respectively. Resilient clips 34, 36 are designed to engage respective spring coils 46, 48. Thus, when the spring is compressed or permitted to expand the coils move relative to each other in the direction shown by the arrows. This relative movement is detected through the change in magnetic flux density sensed by hall effect device 12 as it moves relative within the magnetic field produced by magnet 20.

Referring now to FIG. 3, an electro-mechanical actuator 50 is shown which has a spring 52 which biases a positionable piston (not shown) within the actuator. Actuator 50 is provided with a cut out 54 in the wall of the actuator so as to expose a portion of spring 52 to facilitate mounting position detector 10 on the coils of the spring. Actuator 50 is further provided with a terminal connection 56 having a plurality of electrical leads 58 through which signals are received for controlling the position of the piston within the actuator.

As shown, support members 14, 23 of position detector 10 are mounted on respective adjacent coils of spring 52 and electric lead 19 is connected to terminal 56 to transmit the desired feedback signal. As spring 52 is compressed or permitted to expand in response to position changes of the piston, position detector 10 provides an electrical position feedback signal proportional to the relative movement of the coils and consequently indicative of the position of the piston.

A particular advantage of a position detector according to the invention when employed in the manner described is that the relative movement between two adjacent coils is directly proportional to the linear movement of the piston but is substantially less in magnitude. Consequently, the position detector 10 can sense over the entire piston stroke range with a short range of movement between support members 14, 23 and position detector 10 can be of substantially smaller size than would be required with the linear potentiometers previously used.

As is apparent from the foregoing, position detectors according to this invention can be constructed in a simple, inexpensive manner while eliminating problems which may result in operation due to environmental conditions such as moisture, corrosion and the like. There are no electrical contacts which must be maintained. The external mounting capabilities of the detector greatly facilitate servicing if required. It will be readily apparent to those skilled in the art that numerous modifications and alternate constructions and embodiments can be employed without departing from the scope and spirit of the invention. Consequently, the embodiment described herein is to be considered exemplary only and the invention is limited solely by the claims.

We claim:

1. A position detector for use in providing an electrical position feedback signal indicative of the position of a movable, spring-biased element, comprising:
    a sensor support member having means for mounting said sensor support member on a first coil of the spring biasing the movable element;
    a magnetic flux density sensor mounted on said sensor support member;
    a magnet support member having means for mounting said magnet support member on a second coil of the spring, a portion of said magnet support member guidingly engaging a portion of said sensor support member to permit relative linear movement therebetween in response to spring movement;
    a magnet mounted on said magnet support member portion, said magnet producing a magnetic field adjacent said sensor;
    said sensor producing a variable electrical signal proportional to the sensed flux density of the magnetic field in response to relative movement between said first and second spring coils, said signal comprising a position feedback signal indicative of the position of the spring biased element.

2. A position detector according to claim 1 wherein said magnetic flux density sensor comprises a hall effect device.

3. A position detector according to claim 1 wherein at least one of said sensor support member mounting means and said magnet support member mounting means comprises a resilient clip adapted to fit over and engage a respective spring coil.

4. A position detector according to claim 1 wherein said magnet comprises an elongated planar magnet having a flux density which varies along its length.

5. A position detector according to claim 1 wherein said magnet support portion comprises an elongated arm supporting said magnet for linear movement adjacent to a wall of said sensor support member portion, said sensor mounted in said wall.

6. A position detector according to claim 5 wherein said sensor support member portion comprises a passageway for guidingly receiving said elongated arm.

7. A position detector according to claim 1 wherein one of said support members comprises a base portion, and a support member portion comprising an elongated arm cantilevered from said base portion parallel to the spring axis, the respective mounting means being fixed to said base portion.

8. A position detector according to claim 7 wherein the other of said support members comprises a second base portion, and a second support member portion fixed to said second base portion and comprising a passageway for guidingly receiving said elongated arm, the respective mounting means being fixed to said second base portion.

* * * * *